United States Patent
Flanigan et al.

(10) Patent No.: US 10,771,006 B2
(45) Date of Patent: Sep. 8, 2020

(54) PHOTOVOLTAIC ROOF TILES AND METHOD OF MANUFACTURING SAME

(71) Applicant: Tesla, Inc., Palo Alto, CA (US)

(72) Inventors: Daniel Preston Flanigan, Petaluma, CA (US); Alex Christopher Mayer, San Francisco, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 16/034,299

(22) Filed: Jul. 12, 2018

(65) Prior Publication Data

US 2019/0020301 A1 Jan. 17, 2019

Related U.S. Application Data

(60) Provisional application No. 62/531,491, filed on Jul. 12, 2017.

(51) Int. Cl.
| | |
|---|---|
| *H02S 20/25* | (2014.01) |
| *H01L 31/048* | (2014.01) |
| *H01L 31/18* | (2006.01) |
| *H01L 31/046* | (2014.01) |
| *H01L 31/032* | (2006.01) |
| *H01L 31/0296* | (2006.01) |

(52) U.S. Cl.
CPC .......... *H02S 20/25* (2014.12); *H01L 31/0322* (2013.01); *H01L 31/046* (2014.12); *H01L 31/0488* (2013.01); *H01L 31/186* (2013.01); *H01L 31/0296* (2013.01)

(58) Field of Classification Search
CPC ... H02S 20/25; H01L 31/046; H01L 31/0322; H01L 31/0488; H01L 31/186
See application file for complete search history.

(56) References Cited

U.S. PATENT DOCUMENTS

| | | | |
|---|---|---|---|
| 2006/0042680 A1* | 3/2006 | Korman | E04D 3/38 136/251 |
| 2009/0229653 A1* | 9/2009 | Lu | H01L 31/022425 136/249 |
| 2012/0199178 A1* | 8/2012 | Wagner | H01L 31/046 136/249 |
| 2012/0291840 A1* | 11/2012 | Kohnke | H01L 31/076 136/244 |
| 2013/0233380 A1* | 9/2013 | Zhao | H01L 31/02167 136/256 |
| 2016/0087579 A1* | 3/2016 | Moslehi | H01L 31/0516 136/251 |

* cited by examiner

*Primary Examiner* — Jayne L Mershon
(74) *Attorney, Agent, or Firm* — Dentons US LLP

(57) ABSTRACT

A solar tile and method for manufacturing solar tiles as a roofing surface with improved aesthetics that reduce the visual differences between solar and non-solar portions of tile. Roof tiles include an active area of thin-film photovoltaic material and an inactive area of thin-film photovoltaic material.

17 Claims, 6 Drawing Sheets

PHOTOVOLTAIC ROOF TILES AND METHOD OF MANUFACTURING SAME

CROSS-REFERENCES TO RELATED APPLICATIONS

The present application claims priority from and is a nonprovisional application of U.S. Provisional Patent Application No. 62/531,491, entitled "PHOTOVOLTAIC ROOF TILES AND METHOD OF MANUFACTURING SAME," filed on Jul. 12, 2017, the entire contents of which are herein incorporated by reference for all purposes.

FILED OF THE INVENTION

The invention relates to building integrated photovoltaic (BIPV) systems and more specifically to photovoltaic roof tiles and methods of manufacturing photovoltaic roof tiles.

BACKGROUND

Distributed solar is becoming increasingly popular as a source of electric energy in the United States and around the world, however, despite its clear value proposition, for some potential customers, the aesthetics of conventional rooftop solar may be preventing adoption. To capture this segment of consumers, various building integrated photovoltaic (BIPV) roofing systems have been proposed.

Unlike conventional rooftop solar where full-sized solar panels are installed with mounting hardware over an existing roof surface, in BIPV systems the power generating elements are built into roof surface components. For example, roofing tiles that contain photovoltaic elements may be integrated with standard roof tiles to create a uniform aesthetic while allowing customers to enjoy the same financial and environmental benefits of generating their own solar energy that conventional solar owners enjoy.

One challenge of BIPV roofing systems is achieving visual uniformity. In various prior art BIPV roofing systems, the active solar roof portions are so visibly distinct from other roof materials that it is easy to tell which tiles contain solar and which do not. This creates a non-uniform aesthetic with stark contrast between active and non-active sections of the roof.

This problem of visual mismatch, however, is not limited to BIPV versus non-BIPV sections of the roof. Even within a single roof tile and/or BIPV roofing module, the solar cells or active solar regions are clearly distinguishable from the other surrounding materials. This is due in part to edge setback constraints that impose a fixed, non-active edge border around active solar portions of solar roof tiles or BIPV roofing modules. Therefore, there exists a need for a solar roof tile or BIPV roofing module that ameliorates deficiencies of prior art BIPV roofing systems.

BRIEF SUMMARY

Various embodiments provide a new and improved approach to manufacturing solar tiles as a roofing surface. Some aspects have improved aesthetics that reduce the visual differences between solar and non-solar portions of the roof and between active solar portions and other portions of a roof tile. These and other embodiments are discussed in greater detail in the detailed description and drawing figures.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive.

DETAILED DESCRIPTION

Figure 1:
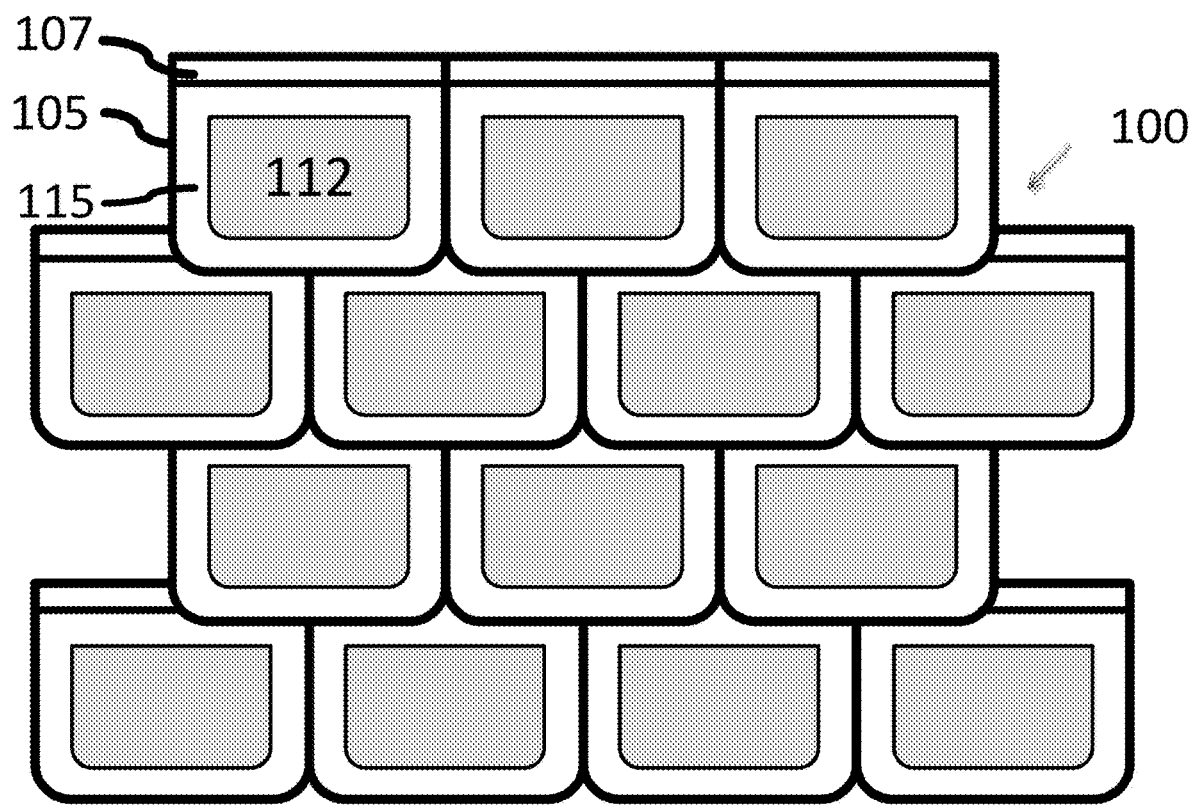
FIG. 1 shows a portion of an array of BIPV roof tiles.

Referring now to the drawing figures, FIG. 1 shows a portion of an array 100 of BIPV roof tiles. Array 100 may be part of the roof of a residence, commercial building or other structure. Array 100 includes individual BIPV roof tiles 105 installed over an underlying roof structure in a manner similar to that of conventional roofing materials (e.g., shingles, shakes, tiles, etc.). For example, individual tiles 105 may be screwed, nailed, or otherwise attached to battens, or in other cases, directly to the underlying roof structure via header portion 107. As shown, each BIPV roof tile includes one tile area portion, however BIPV roof tiles may include multiple tile area portions, for example groups of 2, 3, 4, or N tile area portions manufactured together as a single unitary structure, for example as disclosed in U.S. application Ser. No. 15/909,808 "PV Tile Mount System" and U.S. application Ser. No. 15/910,310 "Interlock BIPV Roof Tile with Backer", both of which are incorporated by reference in their entirety. A BIPV roof tile with one or more tile area portions may include a single pair of external leads (V+, V−) electrically coupled to the active portions of the photovoltaic cells of the module. A multi-tile area module may be installed using the same techniques as a single tile module. Multi-tile modules may speed up installation, improve reliability (by reducing external connections), and save costs (reducing total connector count) relative to individual solar roof tiles. Embodiments of the invention include individual solar roof tiles as well as multiple tile area BIPV modules that include multiple active areas of photovoltaic material, i.e. multiple solar cells.

Tiles 105 shown in FIG. 1 have an active (i.e., energy generating) area 112 comprised of thin-film solar material, such as, for example, copper indium gallium (di)selenide (CIGS), amorphous silicon (a-Si), cadmium telluride (CdTe), pervoskite, etc. Thin-film PV can be advantageous over conventional silicon cell technology in applications like BIPV roofing because it can be formed into a variety of different 2-dimensional shapes, as well as can be applied to curved surfaces. By contrast, conventional silicon-based cells are made from slivers, e.g. wafers, of silicon ingots, and thus have a relatively fixed planar geometry. This flexibility of thin-film solar makes the embodiments of the disclosed technology particularly useful when used with thin-film solar.

Historically, mono- and poly-crystalline cells have outperformed thin-film in terms of their efficiency, however, the greater flexibility in design of thin-film may eliminate the degree to which filters, paints, textures and other production-reducing techniques used with silicon-based cells need to be employed.

As shown in FIG. 1, active areas 112 are bordered by an adhesion zone 115, where thin-film photovoltaic material is not present. In embodiments, and as is shown in greater detail in FIG. 2, adhesion zone 115, where materials making up the stack are joined, may overlap with the setback region 116. This adhesion zone may be formed from glass frit or other masking and/or adhesion materials. Due to the adhesion zone not including the thin-film photovoltaic material, it will be visibly different than the portion of the active area 112 containing active thin-film solar.

Figure 3:
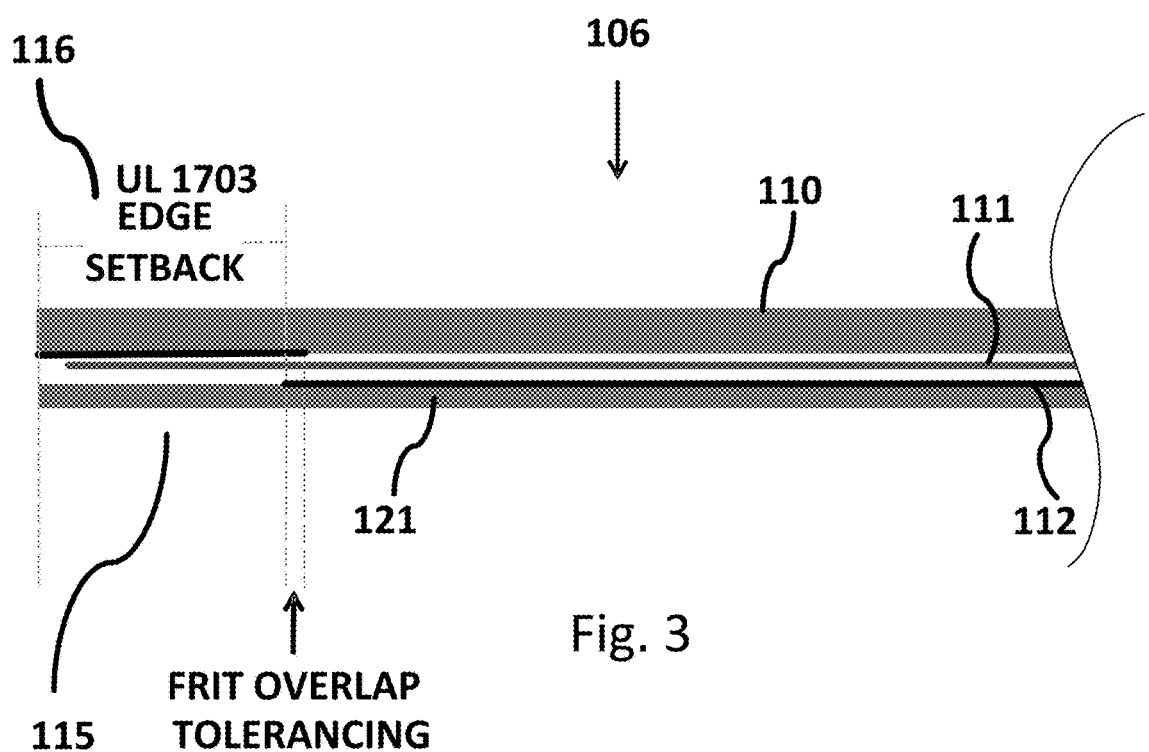
FIG. 3 shows a cross sectional view of a portion of BIPV roof tile.

In embodiments, base substrate 120 may extend all the way to the edge, as in a full glass-on-glass stack-up, however the lack of active material as well as the addition of glass frit or other adhesion material will also cause the setback region to look visibly different than active area 112, as shown in FIG. 3.

Figure 2:
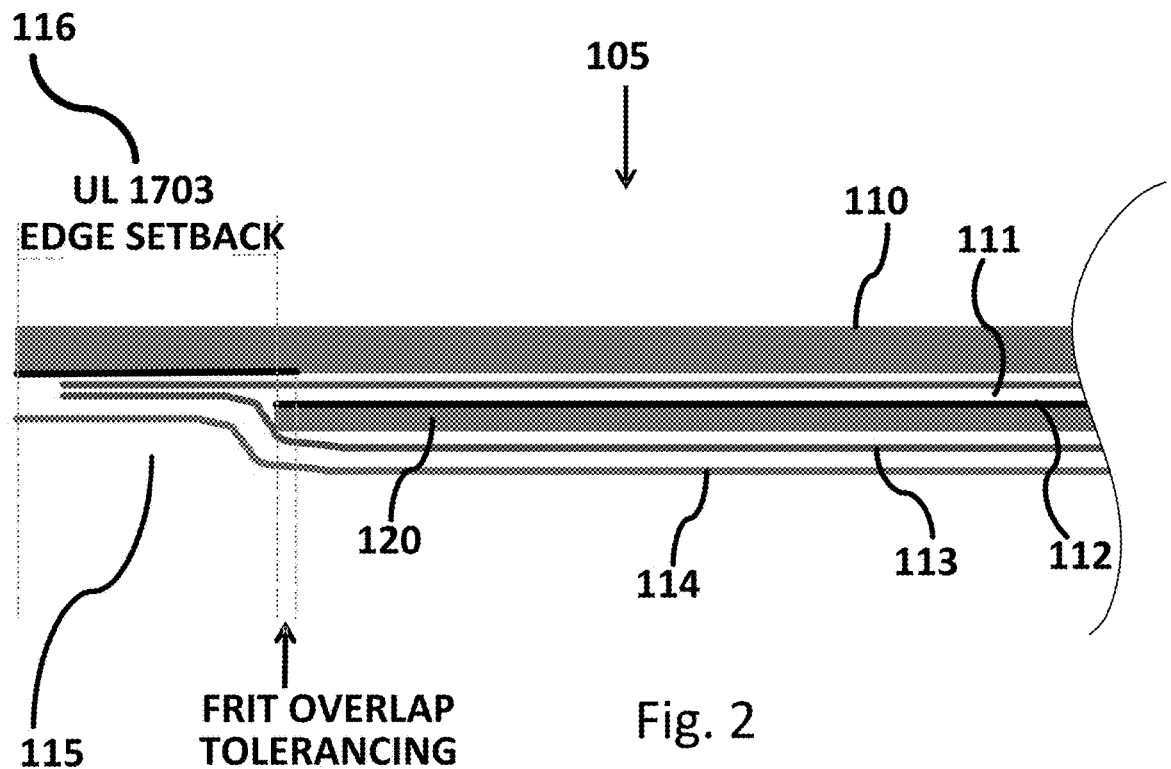
FIG. 2 shows a cross sectional view of a portion of BIPV roof tile.

Referring now to FIG. 2, this figure is a cross sectional view of a portion of BIPV roof tile 105 showing one edge and internal layer details. As shown, tile 105 comprises an active area 112 comprising a thin-film PV layer, for example CIGS thin-film, formed on base substrate 120. In embodiments, base substrate 120 is glass, however, other suitable substrate materials may also be used, for example as disclosed in Ser. Nos. 15/909,808 and 15/910,310, which are incorporated by reference. The thin-film PV layer of active area 112 and base substrate 120 are encapsulated between top glass 110, also referred to as a top sheet or light transmissive top sheet, and back sheet 114 via respective top and bottom layers of encapsulant 111 and 113.

Figure 4:
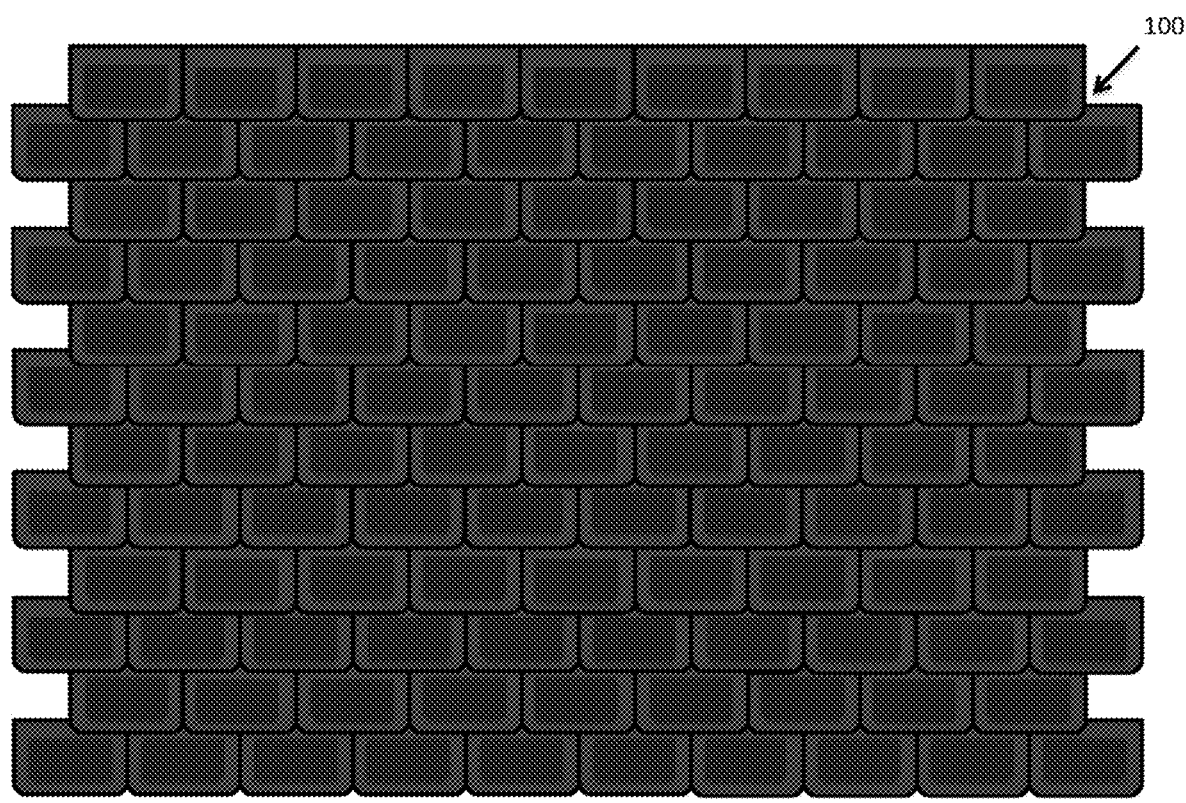
FIG. 4 shows a portion of an array of BIPV roof tiles.

As shown in FIG. 2, and consistent with UL 1703, a 16 mm edge setback 116 is present between the edge of tile 105 and active area 112. In embodiments, a smaller or larger setback size may be used (e.g., 14 mm, 14.5 mm, 15 mm 15.5 mm, etc.). As used herein, setback refers to the buffer of non-active region relative to the tile edge that prevents arcing or other unintended current leakage and does not impose any masking or other material requirements. Although in FIG. 2 setback region 116 overlaps with backsheet adhesion zone 115, in embodiments, a sufficient adhesion may be realized with an adhesion zone smaller than the required or desired edge setback. Conventionally, setback compliance may be accomplished by limiting the size of the active area and base substrate relative to the top glass so that the base substrate and active material are smaller in footprint than the top glass, as seen in FIG. 2. This works, but adds to the aesthetic inconsistency seen in FIGS. 1 and 4.

FIG. 3 illustrates a full glass-on-glass PV tile 106. In this example, the stack is limited to top glass 110, encapsulant 111, active area 112, and bottom glass 121; bottom encapsulant and backsheet layers are not present in this glass-on-glass embodiment. In embodiments, a mask may be used when depositing active thin-film material on base substrate 120 in order to prevent thin-film material from being deposited in edge setback region 116.

In either tile 105 of FIG. 2 or tile 106 of FIG. 3, the lack of active thin-film material within the edge setback results in a relatively large, e.g. ~16 mm, visible border around the outside of active area 112 that is noticeable not only when viewed up close, but even at street level distances from a roof surface. This result can be seen in the extended partial array 100 of FIG. 4. The relatively large percentage of tile surface area of the edge setback that is devoid of thin-film material creates a sharply contrasting two-color/two-tone pattern between the area surrounding the active area of thin-film photovoltaic material and the active area of thin-film photovoltaic material. In embodiments, techniques are used to provide aesthetic uniformity such as depositing colored material on the underside of top glass 110 prior to lamination to conceal active area 112 beneath. This approach however may result in a reduction in energy collection because these extra materials may block photons from reaching active area 112.

As a note, for clarity purposes, conductive bussing, and other internal electrical connection have been omitted from FIGS. 2 and 3 for clarity purposes. In embodiments, one or more conductive tabs and or ribbons may be electrically connected to and extend from the thin-film photovoltaic material of active area 112 between the top glass and bottom encapsulant and backsheet layers out of the tile to be connected to a power distribution system. Also, although FIGS. 2 and 3 illustrate CIGS thin-film, the principles shown and discussed may be used with other thin-film types. For example, in the case of CdTe thin-film, active area 112 may be formed on the backside of top glass 110 rather than on substrate 120. The embodiments of the invention will work with either type of thin-film solar.

In embodiments, glass frit or other material within adhesion zone 115 may be colored to reduce the contrast with active area 112 but the difference in materials may result in a visually detectable difference when viewed at distances and varying intensities and angles of ambient sunlight.

Figure 5:
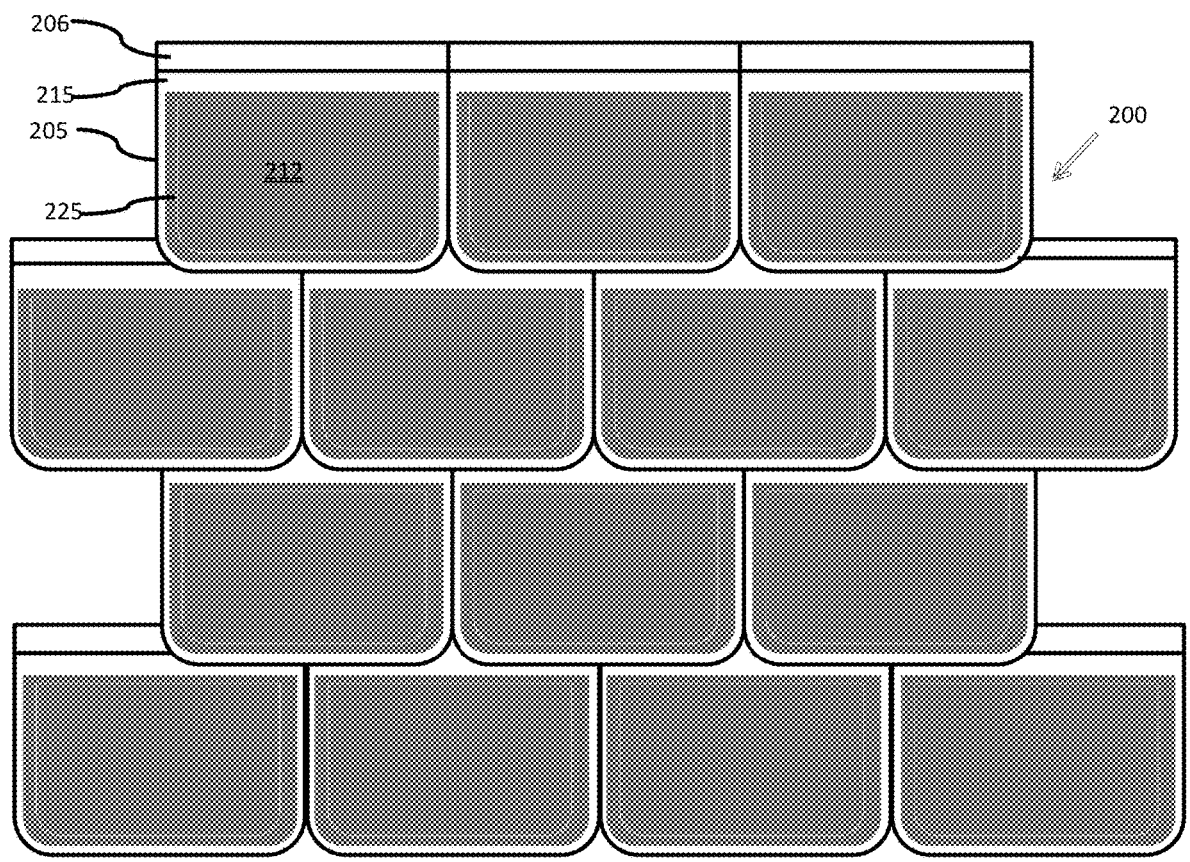
FIG. 5 shows a portion of an array of BIPV roof tiles.
Figure 8:
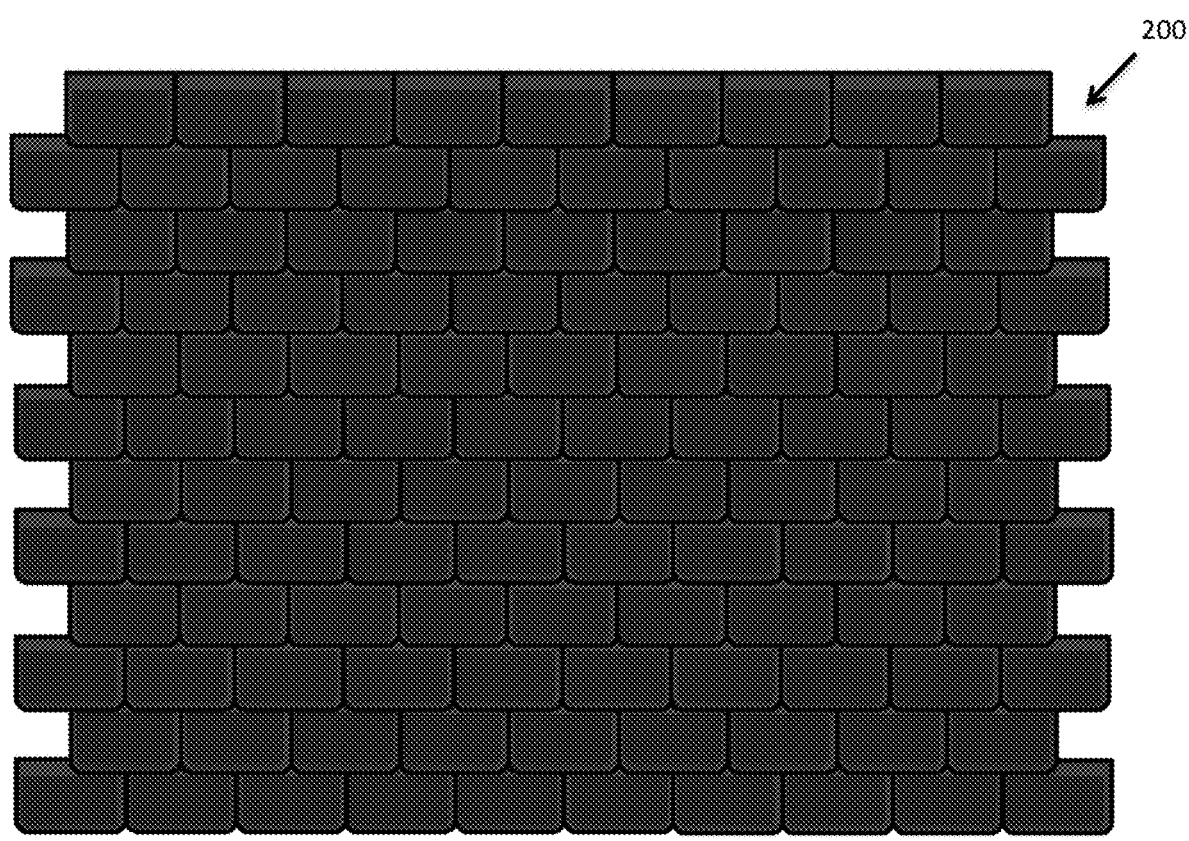
FIG. 8 shows a portion of an array of BIPV roof tiles.

Referring now to FIG. 5, this figure shows a portion of array 200 of BIPV roof tiles manufactured according to various embodiments of the invention. As seen in the figure, each tile includes a reduced size adhesion area 215, compared to the adhesion area of FIG. 1. Further, as shown, the tiles 205 include a substantially rectangular active 212 surrounded by a substantially rectangular board of an inactive area 225. In embodiments, the inactive area may completely surround the active area or may only be present on one, two or three sides of the active area. As shown in FIG. 5, the tiles 205 create a more uniform look and, when viewed at distances, such as in shown in FIG. 8, adhesion area 215 blends into the natural seams between adjacent tiles or between active areas 212 of adjacent tile sections. The visible material difference has been attenuated by the use of non-active thin-film material within a portion of the setback region allowing for a smaller adhesion zone.

Figure 6:
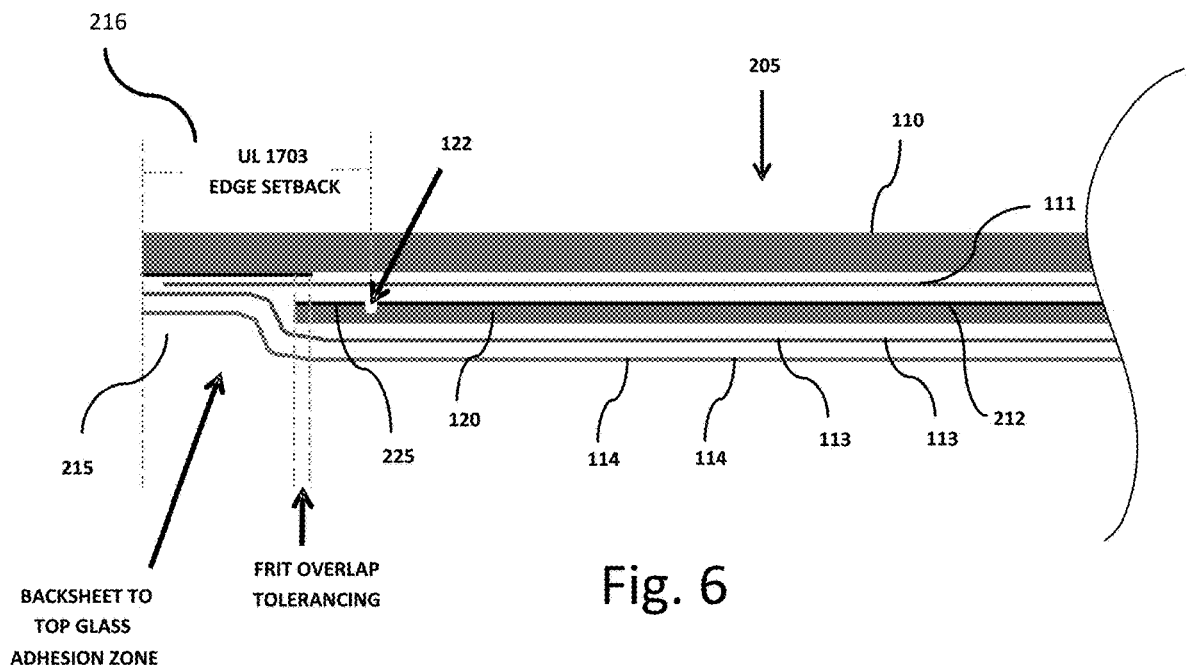
FIG. 6 shows a cross sectional view of a portion of BIPV roof tile.

FIG. 6 shows a cross-section with a reduced adhesion zone 215. With a reduced adhesion zone, an apparent border of array 200 may be accomplished while still complying with UL setback requirements. As shown in FIG. 6, tile 205 may be produced in a similar manner as tile 105 of FIG. 2. However, as shown, base substrate 120 includes both an active area 212 and an inactive area 225 of thin-film photovoltaic material. As shown, the combined area of the thin-film photovoltaic material of active area 212 and inactive area 225 is larger than active area 112 of FIG. 1, and may be formed by depositing thin-film photovoltaic material in a portion of setback region 216. In embodiments, the thin-film layer may extend an additional 5 mm closer to the base substrate edge, and in embodiments, it may extend even further. In order to comply with setback requirements, the portion of thin-film PV within edge setback 216 is rendered inactive. As used herein, inactive photovoltaic material is electrically isolated from power generating photovoltaic material, and is not connected to a power distribution system. Inactive photovoltaic material is for aesthetic purposes. In embodiments, after the thin-film is deposited on the base substrate, a portion of the thin-film material is removed from the substrate at the edge setback distance in order to separate and define the active area and the inactive area. In embodiments, removal of thin-film material is done using a thin-film laser scribing system, a chemical etching process, or another destructive process to make a narrow cut 122 in the thin-film material at the desired edge setback distance (e.g. 15 mm from the edge). This will leave thin-film inactive area 225 under the layer of top-glass 110 in order to reduce the visible border of the adhesion area while remaining in compliance with edge setback requirements. In embodiments, inactive area 225 and active area 212 may be initially deposited as separate area, for example with a mask in one or two deposition steps. In embodiments, a roof tile may include a plurality of active areas that may be separated by one or more inactive areas.

Many different processes may be used to achieve this result. In embodiments, pulsed lasers are particularly advantageous in that they can be applied through glass without removing or damaging the base substrate or top glass. Cut 122 electrically isolates the inactive area 225 of thin-film material overlapping with edge setback 216, thereby rendering it inactive. As illustrated, the size of cut 122 is exaggerated for ease of illustration. In embodiments, the width of the cut may be a few to tens of microns, for example less than 100 microns. A small cut width prevents the boundary between the active and inactive areas of thin-film from being visible at street level distances (for example 20+ feet away), and makes the cut only barely visible up close (for example less than a foot away). In this way, the entire desired and/or required setback may be achieved without the aesthetically unappealing large apparent difference in materials around the edges of the active area 212. In embodiments, adhesion zone 215 may be formed in the same way as adhesion zone 115 of FIG. 2.

Figure 7:
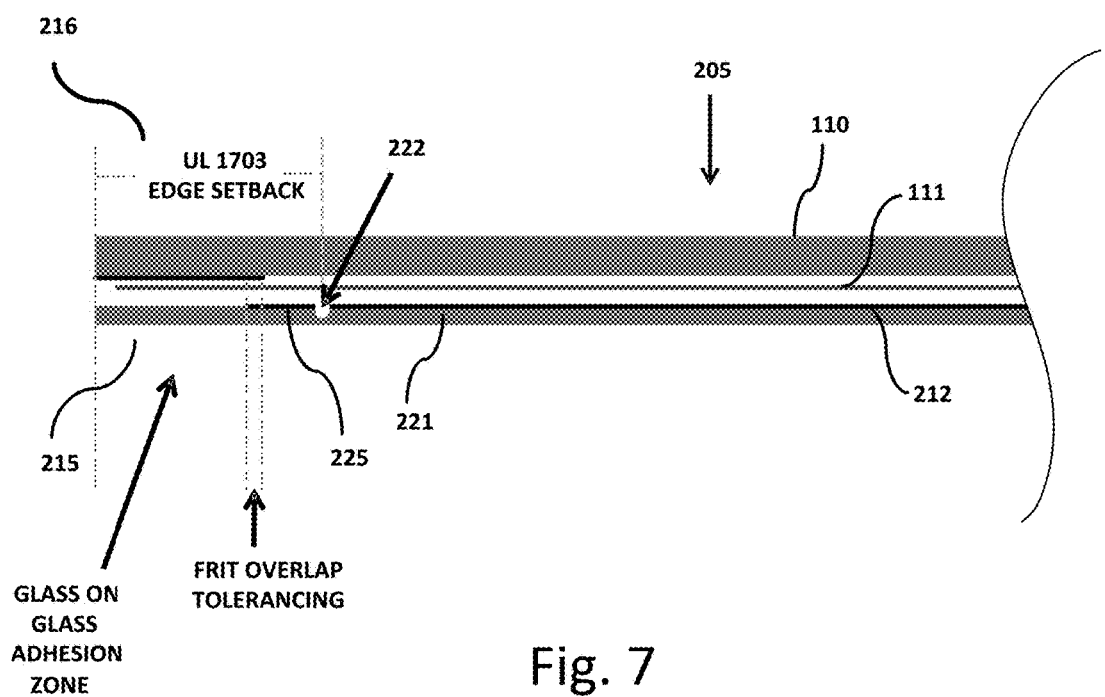
FIG. 7 shows a cross sectional view of a portion of BIPV roof tile.

FIG. 7 illustrates an embodiment of the invention applied to a full glass-on-glass solar roof tile. Tile 205 includes top glass 110, encapsulant 111, active area thin-film layer 212 and bottom glass 221. As shown in FIG. 7, a thin-film layer including active area 212 and inactive area 225 is formed on bottom glass 221 in a pattern that overlaps with edge setback region 216. In order to comply with setback spacing, cut 222 is made at the setback border (e.g., 15 mm) to render inactive the thin-film material within edge setback 216. In embodiments, for example as shown, the adhesion zone 215 is approximately 5 mm smaller than setback 216, but other relative dimensions are possible. In embodiments, the aesthetic benefits will be achieved when the adhesion zone is minimized and inactive thin-film area 225 is maximized.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further, any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

What is claimed is:

1. A photovoltaic tile comprising:
a light transmissive top sheet;
a base substrate, wherein the base substrate is adhered to the top sheet;
an active area of photovoltaic material between the base substrate and the top sheet; and
an inactive area of photovoltaic material between the base substrate and the top sheet; and
an adhesive material disposed between the inactive area of photovoltaic material and the top sheet forming an adhesion region,
wherein the inactive area of photovoltaic material is located between an edge of the base substrate and the active area of photovoltaic material,
wherein the inactive area of photovoltaic material is continuous and surrounds the active area of photovoltaic material on the base substrate.

2. The photovoltaic tile of claim 1, wherein the photovoltaic materials of the active area and the inactive area are the same type of thin-film solar material.

3. The photovoltaic tile of claim 2, wherein the thin-film solar material is deposited on the base substrate.

4. The photovoltaic tile of claim 3, wherein the active area of photovoltaic material is substantially rectangular and the inactive area of photovoltaic material forms a continuous rectangular border around the active area of photovoltaic material.

5. The photovoltaic tile of claim 4, wherein a continuous portion of the base substrate without deposited thin-film solar material is directly adjacent to and surrounds the inactive area of photovoltaic material.

6. The photovoltaic tile of claim 4, wherein the rectangular border comprises a width of greater than 5 mm.

7. The photovoltaic tile of claim 1, wherein the inactive area of photovoltaic material does not directly contact the active area of photovoltaic material and is separated by a continuous gap on the base substrate surrounding the active area of photovoltaic material, and
wherein the continuous gap is located at a predetermined distance from the edge of the base substrate in order for the active area of photovoltaic material to comply with a setback requirement.

8. The photovoltaic tile of claim 7, wherein the continuous gap is less than 100 microns.

9. The photovoltaic tile of claim 8, wherein the continuous gap is laser scribed through the base substrate.

10. The photovoltaic tile of claim 1, wherein the inactive area of photovoltaic material surrounds a second active area of photovoltaic material on the base substrate, distinct from and not directly contacting the active area of photovoltaic material.

11. A photovoltaic roof tile comprising:
a light transmissive top sheet;
a layer of thin-film photovoltaic material on a base substrate, the layer of thin-film photovoltaic material, comprising;
an active area of photovoltaic material and an inactive area of photovoltaic material, wherein the inactive area of photovoltaic material is located between an edge of the base substrate and the active area of photovoltaic material; and
encapsulating material surrounding the active area of photovoltaic material and the inactive area of photovoltaic material and disposed between the base substrate and the light transmissive top sheet; and
an adhesive material disposed between the inactive area of photovoltaic material and the light transmissive top sheet forming an adhesion region,
wherein the inactive area of photovoltaic material is continuous and surrounds the active area of photovoltaic material on the base substrate.

12. The photovoltaic roof tile of claim 11, wherein the inactive area of photovoltaic material does not directly contact the active area of photovoltaic material and is separated by a continuous gap on the base substrate surrounding the active area of photovoltaic material, and
wherein the gap is located at a predetermined distance from the edge of the base substrate in order for the active area of photovoltaic material to comply with a setback requirement.

13. The photovoltaic roof tile of claim 12, wherein the gap is less than 100 microns.

14. The photovoltaic roof tile of claim 11, wherein the layer of thin-film photovoltaic forms a substantially rectangular active area of photovoltaic material and a continuous substantially rectangular border of inactive area of photovoltaic material around the active area of photovoltaic material.

15. The photovoltaic roof tile of claim 14, wherein the rectangular border comprises a width of greater than 5 mm.

16. The photovoltaic roof tile of claim 11, wherein the layer of thin-film photovoltaic material further comprises a second active area of photovoltaic material on the base substrate, distinct from the active area of photovoltaic material.

17. A photovoltaic roof tile comprising:
a light transmissive top sheet;
a thin-film photovoltaic material, comprising:
an active area and an inactive area of the thin-film photovoltaic material disposed on a base substrate, wherein the inactive area is located between an edge of the base substrate and the active area of the thin-film photovoltaic material; and
an adhesive material disposed between the inactive area of the thin-film photovoltaic material and the light transmissive top sheet forming an adhesion region,
wherein the inactive area of the thin-film photovoltaic material is continuous and surrounds the active area of the thin-film photovoltaic material on the base substrate.

* * * * *